(12) United States Patent
Otsuka

(10) Patent No.: US 12,255,170 B2
(45) Date of Patent: Mar. 18, 2025

(54) SEMICONDUCTOR PACKAGE, ELECTRONIC APPARATUS, AND METHOD FOR MANUFACTURING SEMICONDUCTOR PACKAGE

(71) Applicant: SONY SEMICONDUCTOR SOLUTIONS CORPORATION, Kanagawa (JP)

(72) Inventor: Yasushi Otsuka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 348 days.

(21) Appl. No.: 17/638,083

(22) PCT Filed: Jun. 17, 2020

(86) PCT No.: PCT/JP2020/023721
§ 371 (c)(1),
(2) Date: Feb. 24, 2022

(87) PCT Pub. No.: WO2021/044703
PCT Pub. Date: Mar. 11, 2021

(65) Prior Publication Data
US 2022/0208718 A1  Jun. 30, 2022

(30) Foreign Application Priority Data

Sep. 4, 2019  (JP) .................................. 2019-161196

(51) Int. Cl.
*H01L 23/00*  (2006.01)
*H01L 27/146*  (2006.01)

(52) U.S. Cl.
CPC ............. *H01L 24/73* (2013.01); *H01L 24/32* (2013.01); *H01L 24/48* (2013.01); *H01L 24/85* (2013.01);
(Continued)

(58) Field of Classification Search
CPC ............. H01L 27/146; H01L 27/14636; H01L 24/73; H01L 27/14618; H01L 24/85;
(Continued)

(56) References Cited

U.S. PATENT DOCUMENTS

2011/0149423 A1* 6/2011 Lasfargues ............... H01L 24/14
257/443
2011/0174527 A1* 7/2011 Nagamatsu ............. H01L 24/16
257/E21.511
(Continued)

FOREIGN PATENT DOCUMENTS

JP  2007067142 A  3/2007
JP  2011-066078 A  3/2011
(Continued)

OTHER PUBLICATIONS

International Search Report and Written Opinion of PCT Application No. PCT/JP2020/023721, issued on Sep. 24, 2020, 09 pages of ISRWO.

(Continued)

*Primary Examiner* — Mouloucoulaye Inoussa
(74) *Attorney, Agent, or Firm* — CHIP LAW GROUP

(57) ABSTRACT

In a semiconductor package in which a semiconductor element is connected to a substrate, the semiconductor element is prevented from being warped. The semiconductor package includes a substrate, the semiconductor element, a bonding portion, and protrusions. First ends of wires are connected to a front surface of the substrate. Second ends of wires are connected to one surface of opposite surfaces of the semiconductor element. The bonding portion bonds a part of the other surface of the opposite surfaces of the semiconductor element and the front surface of the substrate. The protrusions protrude from the front surface of the
(Continued)

substrate to a remaining part of the other surface of the opposite surfaces of the semiconductor element.

10 Claims, 15 Drawing Sheets

(52) U.S. Cl.
CPC ............... *H01L 27/14618* (2013.01); *H01L 27/14636* (2013.01); *H01L 27/14683* (2013.01); *H01L 2224/32221* (2013.01); *H01L 2224/48221* (2013.01); *H01L 2224/73265* (2013.01); *H01L 2224/85205* (2013.01); *H01L 2924/3511* (2013.01)

(58) Field of Classification Search
CPC ......... H01L 24/32; H01L 23/02; H01L 24/48; H01L 23/12; H01L 23/34; H01L 27/14623; H01L 27/14625; H01L 31/024; H01L 27/14683; H01L 23/10; H01L 27/14609; H01L 23/295; H01L 23/3732; H01L 24/29; H01L 24/33; H01L 23/3735; H01L 23/544; H01L 23/3677; H01L 24/92; H01L 24/16; H01L 25/0657; H01L 23/5386; H01L 23/49833; H01L 24/17; H01L 24/06; H01L 23/562; H01L 24/14; H01L 2224/73265; H01L 2224/85205; H01L 2224/48221; H01L 2224/32221; H01L 2924/3511; H01L 2224/92247; H01L 2224/73204; H01L 2224/50; H01L 2224/48471; H01L 2224/83385; H01L 2224/48091; H01L 2224/83192; H01L 2224/48228; H01L 2224/48465; H01L 2224/48479; H01L 2224/8592; H01L 2924/00014; H01L 2224/13294; H01L 2224/16238; H01L 2224/17181; H01L 2924/16251; H01L 2223/54426; H01L 2924/16195; H01L 2224/16013; H01L 2224/92227; H01L 2224/29393; H01L 2224/13393; H01L 2224/73257; H01L 2224/16258; H01L 2924/16235; H01L 2924/15151; H01L 2224/73253; H01L 2224/16235; H01L 2224/3316; H01L 2224/92225; H01L 2924/172; H01L 2224/81201; H01L 2223/54486; H01L 2224/32225; H01L 2224/48227; H01L 2224/293; H01L 2224/29012; H05K 3/285; H05K 1/0206; H05K 3/284; H05K 2201/032

See application file for complete search history.

(56) References Cited

U.S. PATENT DOCUMENTS

| | | | | |
|---|---|---|---|---|
| 2012/0257075 | A1* | 10/2012 | Kamada | H01L 27/14618 257/E31.127 |
| 2014/0138823 | A1* | 5/2014 | Zhang | H01L 22/12 257/737 |
| 2014/0339668 | A1* | 11/2014 | Arima | H01L 27/14601 257/443 |
| 2016/0141232 | A1* | 5/2016 | Cannon | H01L 23/043 257/659 |
| 2016/0254251 | A1* | 9/2016 | Bae | H01L 23/49833 257/698 |
| 2016/0307876 | A1* | 10/2016 | Yu | H01L 24/13 |
| 2016/0351607 | A1* | 12/2016 | Liu | H01L 27/14618 |
| 2017/0103958 | A1* | 4/2017 | Lee | H01L 24/17 |
| 2018/0366440 | A1* | 12/2018 | Chen | H01L 23/49833 |
| 2020/0303439 | A1* | 9/2020 | Shimizu | H01L 27/14683 |
| 2021/0035883 | A1* | 2/2021 | Swire | H01L 23/295 |
| 2021/0211595 | A1* | 7/2021 | Yamamoto | G02B 13/0045 |
| 2021/0233949 | A1* | 7/2021 | Chino | H01L 23/34 |

FOREIGN PATENT DOCUMENTS

| | | |
|---|---|---|
| JP | 2011-114266 A | 6/2011 |
| JP | 2014-099584 A | 5/2014 |
| JP | 2014165397 A | 9/2014 |

OTHER PUBLICATIONS

Decision to Grant a Patent issued in Japanese Application No. 2021-543963 dated Dec. 24, 2024.

* cited by examiner

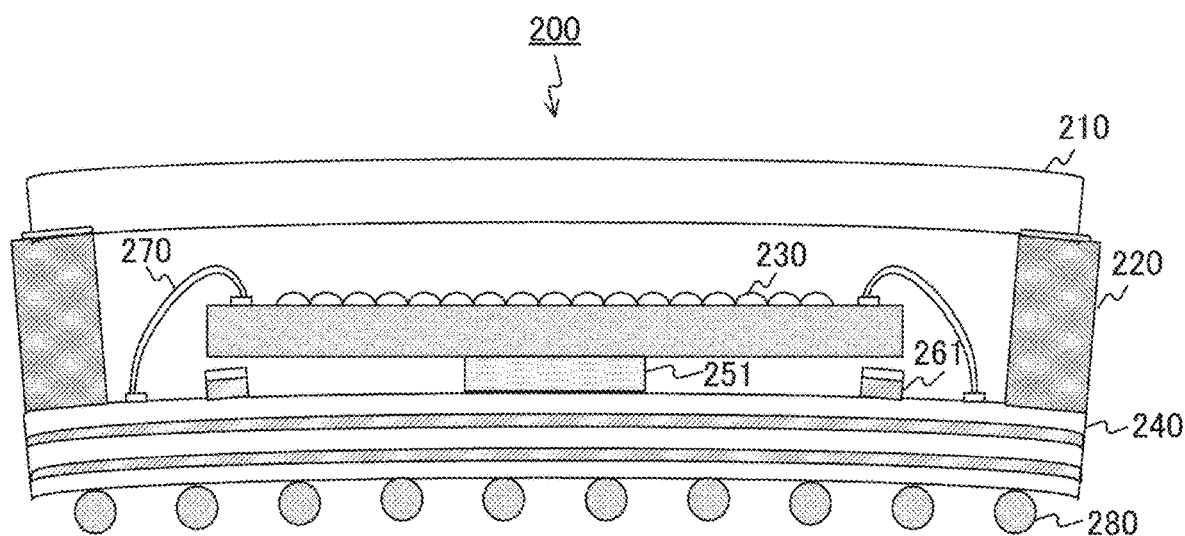
FIG. 5A
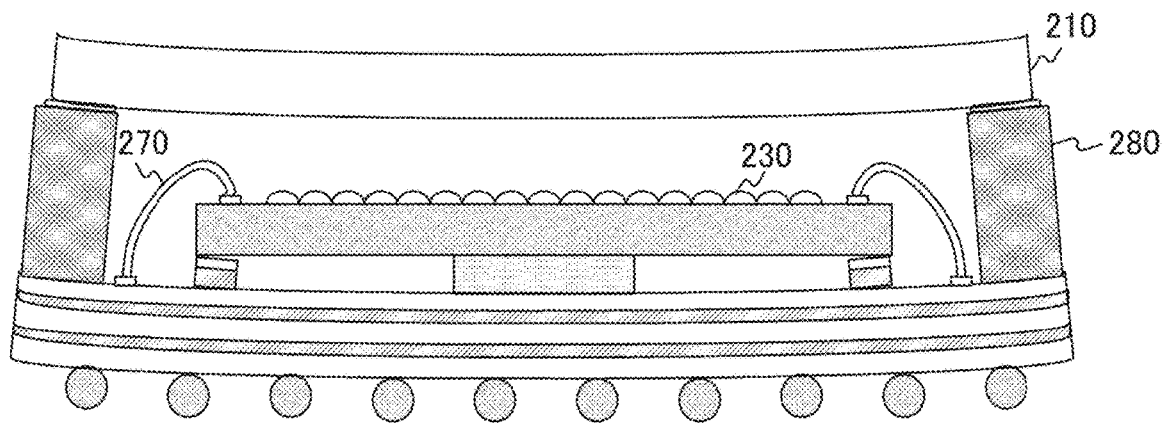
FIG. 5B
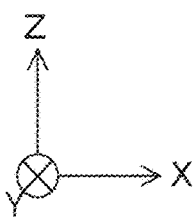

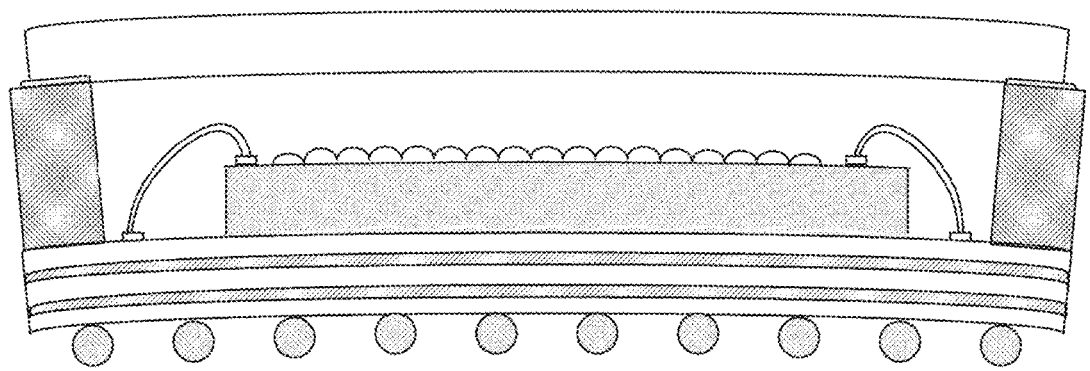
FIG. 6A
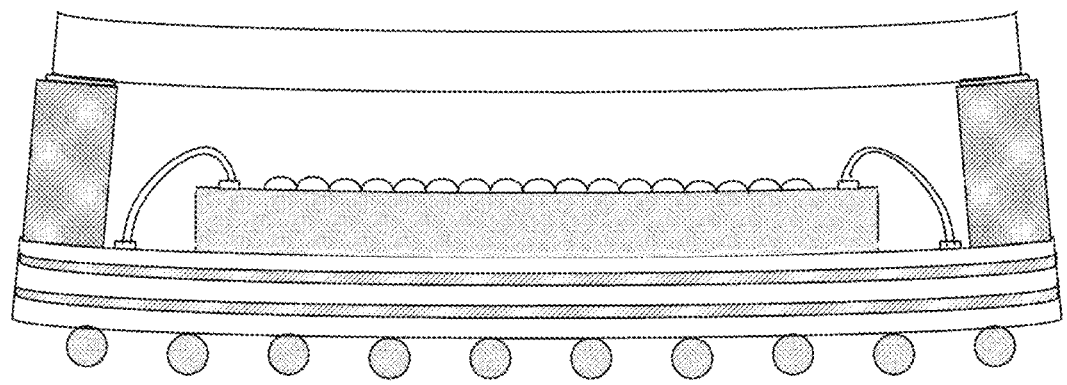
FIG. 6B
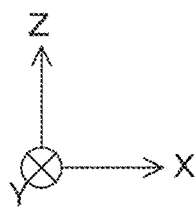

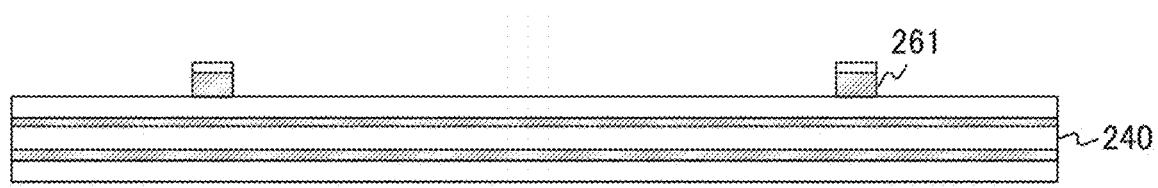
FIG. 7A
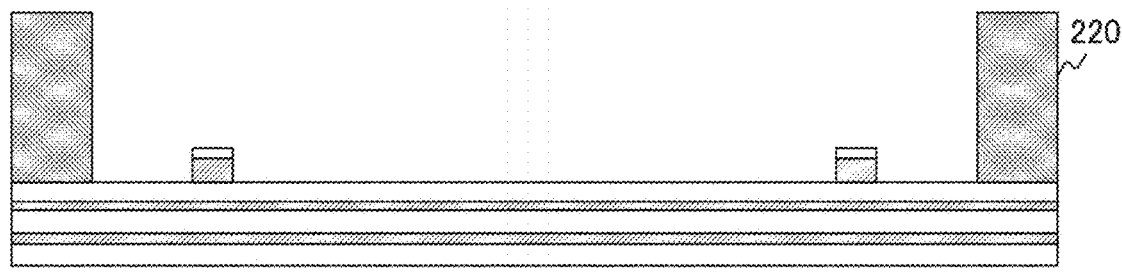
FIG. 7B
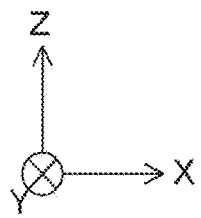

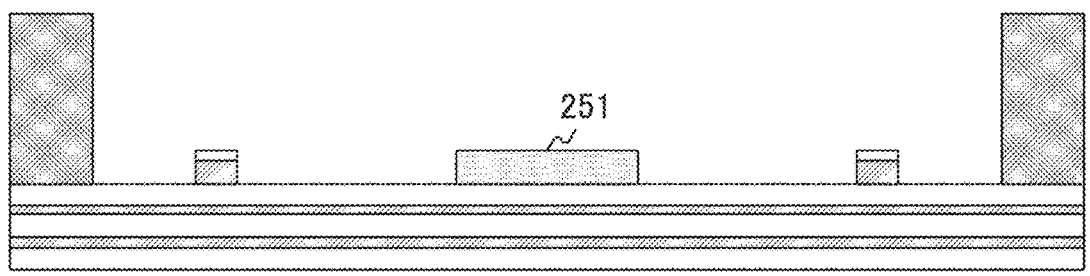
FIG. 8A
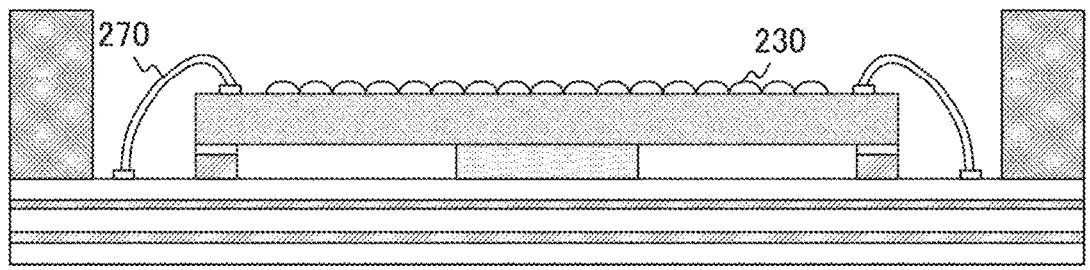
FIG. 8B
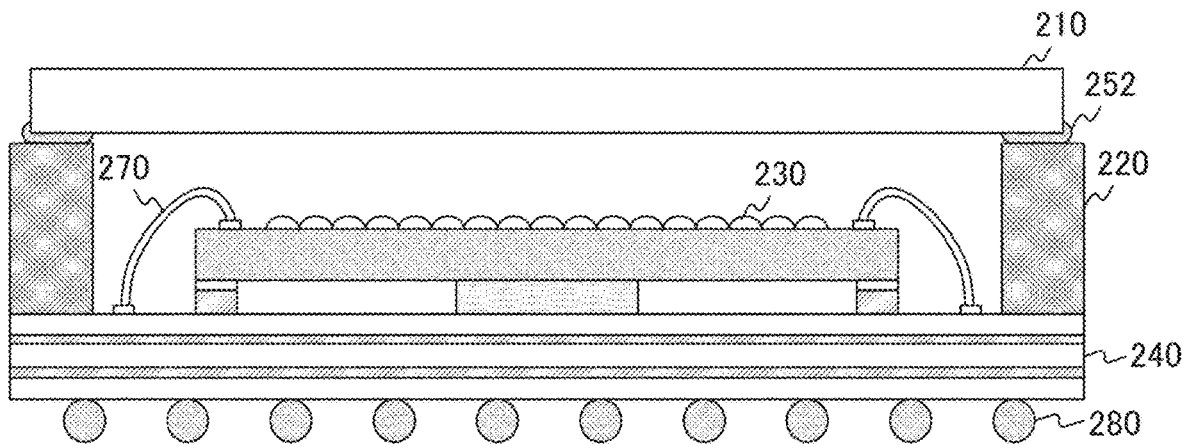
FIG. 8C
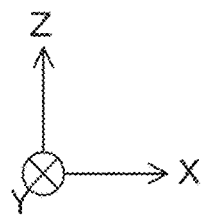

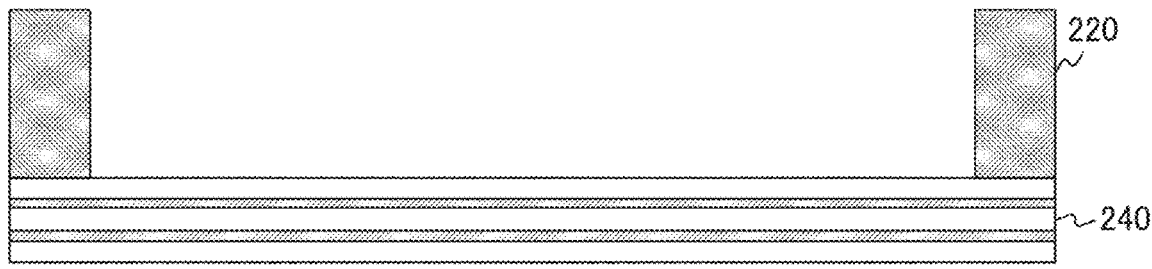
FIG. 10A
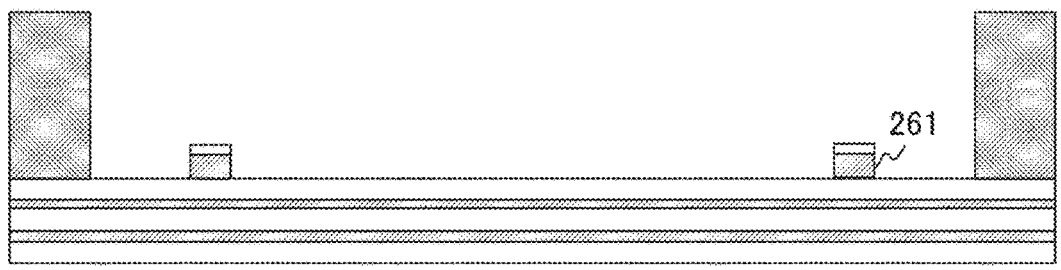
FIG. 10B
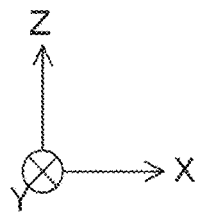

SEMICONDUCTOR PACKAGE, ELECTRONIC APPARATUS, AND METHOD FOR MANUFACTURING SEMICONDUCTOR PACKAGE

CROSS REFERENCE TO RELATED APPLICATIONS

This application is a U.S. National Phase of International Patent Application No. PCT/JP2020/023721 filed on Jun. 17, 2020, which claims priority benefit of Japanese Patent Application No. JP 2019-161196 filed in the Japan Patent Office on Sep. 4, 2019. Each of the above-referenced applications is hereby incorporated herein by reference in its entirety.

TECHNICAL FIELD

The present technology relates to a semiconductor package. Specifically, the present technology relates to a semiconductor package to which a solid-state imaging element is connected with wires, an electronic apparatus, and a method for manufacturing the semiconductor package.

BACKGROUND ART

In the related art, for facilitation of handling of a semiconductor integrated circuit and for other purposes, semiconductor packages are used in which a semiconductor chip provided with the semiconductor integrated circuit is mounted on a substrate and closed. For example, a semiconductor package with a hollow structure has been proposed in which a semiconductor element is electrically connected to a substrate with wires and sealed with glass with an a ray shielding film (see, for example, PTL 1). Additionally, in the semiconductor package, one of opposite surfaces of the semiconductor element is entirely bonded to the substrate with an adhesive.

CITATION LIST

Patent Literature

PTL 1
  JP 2011-114266A

SUMMARY

Technical Problem

In the semiconductor package described above, the a ray shielding film is attached to glass to shield a rays, thus reducing lattice defects in the semiconductor element caused by the a rays. However, in the semiconductor package described above, in a case where the substrate contains a plurality of layers with different coefficients of thermal expansion, a change in temperature may cause the substrate to be warped. There is a problem in that a warped substrate also warps the semiconductor element because the surface of the semiconductor element is entirely bonded to the substrate. In particular, in a case where the semiconductor element is a solid-state imaging element, the warpage distorts an image surface, degrading image quality of image data.

In light of such circumstances, an object of the present technology is to prevent the semiconductor element from being warped in the semiconductor package in which the semiconductor element is connected to the substrate.

Solution to Problem

The present technology has been developed to solve the problems described above, and a first aspect provides a semiconductor package including a substrate including a front surface to which first ends of wires are connected, a semiconductor element including opposite surfaces with second ends of the wires connected to one surface of the opposite surfaces, a bonding portion bonding a part of another surface of the opposite surfaces and the front surface of the substrate, and protrusions protruding from the front surface of the substrate to a remaining part of the other surface. This is effective in preventing the semiconductor element from being warped.

Additionally, in the first aspect, the bonding portion may bond a central portion of the other surface and the front surface of the substrate. This is effective in preventing the semiconductor element from being warped.

Additionally, in the first aspect, the protrusions may be formed like islands. This is effective in that the island-like protrusions receive loads.

Additionally, in the first aspect, the semiconductor element may be shaped like a rectangle, and the protrusions may be respectively formed linearly along a plurality of sides of the rectangle. This is effective in that the linear protrusions receive loads.

Additionally, in the first aspect, the protrusion may be formed like a frame along an outer periphery of the semiconductor element. This is effective in that the frame-like protrusion receives loads.

Additionally, in the first aspect, the semiconductor element may be a solid-state imaging element. This is effective in improving the image quality of image data.

Additionally, a second aspect of the present technology provides an electronic apparatus including a substrate including a front surface to which first ends of wires are connected, a semiconductor element including opposite surfaces with second ends of the wires connected to one surface of the opposite surfaces, a bonding portion bonding a part of another surface of the opposite surfaces and the front surface of the substrate, protrusions protruding from the front surface of the substrate to a remaining part of the other surface, and a processing section processing a signal generated by the semiconductor element. This is effective in processing the signal from the semiconductor element prevented from being warped.

Additionally, a third aspect of the present technology provides a method for manufacturing a semiconductor package, the method including a substrate manufacturing step of manufacturing a substrate provided with protrusions on a front surface of the substrate and a connection step of bonding the front surface of the substrate and a part of one surface of opposite surfaces of a semiconductor element and connecting another surface of the opposite surfaces and the front surface of the substrate with wires. This is effective in bonding a part of the semiconductor element and the front surface of the substrate, manufacturing a semiconductor package provided with the protrusions.

Additionally, in the third aspect, in the substrate manufacturing step, the protrusions may be provided when a wiring pattern for the substrate is formed. This is effective in that the protrusions formed during formation of the wiring pattern receive loads.

Additionally, in the third aspect, in the substrate manufacturing step, the protrusions may be provided on the substrate after the substrate is manufactured. This is effective in that the protrusions provided after manufacturing of the substrate receive loads.

BRIEF DESCRIPTION OF DRAWINGS

FIGS. 5A and 5B are examples of a cross-sectional view of the semiconductor package at high temperature and at low temperature according to an embodiment of the present technology.

FIGS. 6A and 6B are examples of a cross-sectional view of the semiconductor package at high temperature and at low temperature according to a comparative example.

FIGS. 7A and 7B illustrate diagrams for explaining a manufacturing method up to formation of a glass mounting frame according to an embodiment of the present technology.

FIGS. 8A, 8B, and 8C illustrate diagrams for explaining a manufacturing method up to placement of glass and solder balls according to an embodiment of the present technology.

FIGS. 10A and 10B illustrate diagrams for explaining a manufacturing method up to provision of protrusions according to a first modified example of an embodiment of the present technology.

DESCRIPTION OF EMBODIMENT

A form in which the present technology is implemented (hereinafter referred to as an embodiment) will be described below. The description is in the following order.

1. Embodiment (examples in which a part of a solid-state imaging element is bonded to a substrate and in which protrusions are provided on the substrate)

2. Examples of Application to Mobile Body

1. Embodiment

Configuration Example of Electronic Apparatus

Figure 1:
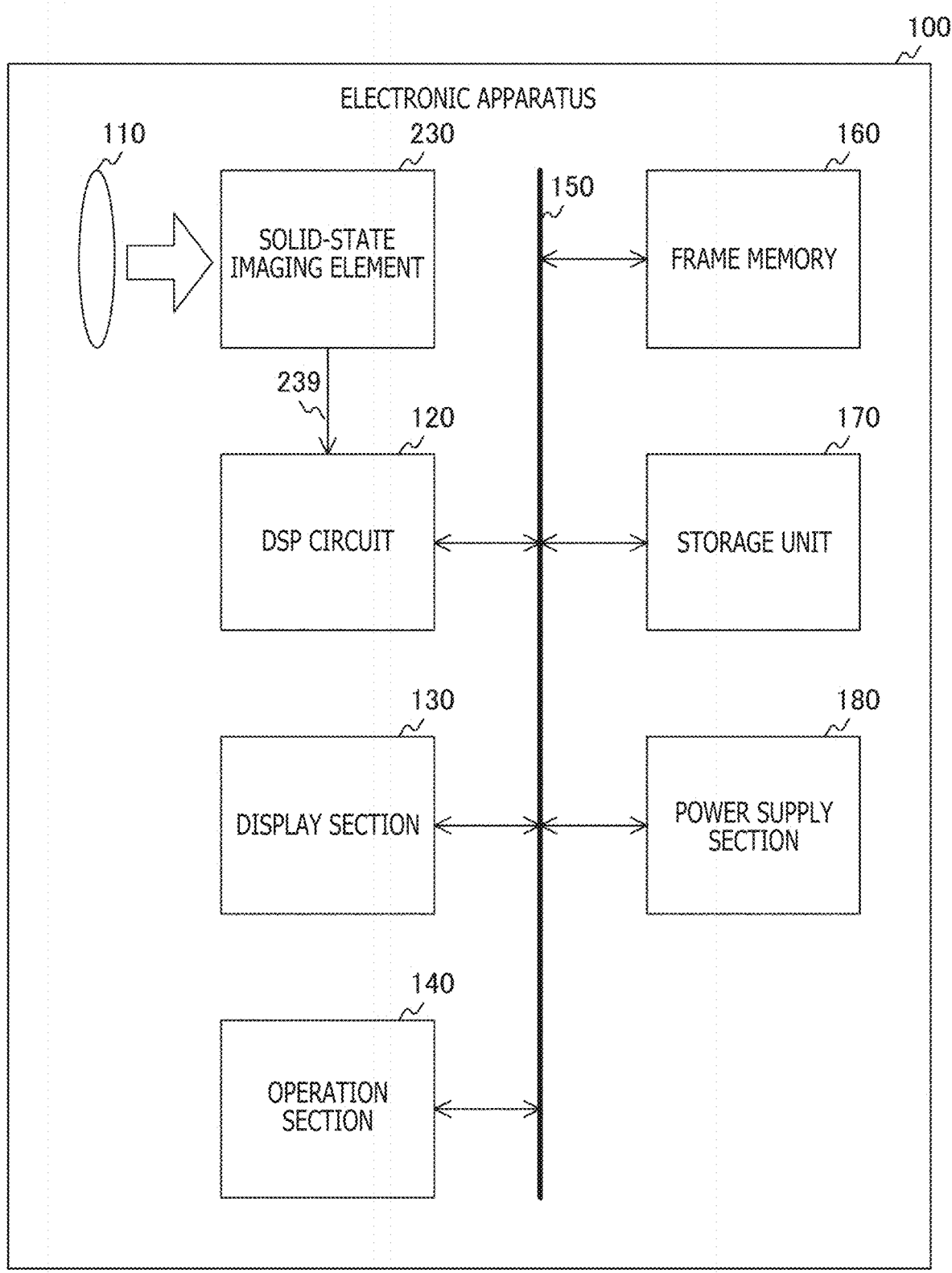
FIG. 1 is a block diagram depicting a configuration example of an electronic apparatus according to an embodiment of the present technology.

FIG. 1 is a block diagram depicting a configuration example of an electronic apparatus 100 according to an embodiment of the present technology. The electronic apparatus 100 is an apparatus for imaging image data, and includes an optical section 110, a solid-state imaging element 230, and a DSP (Digital Signal Processing) circuit 120. Furthermore, the electronic apparatus 100 includes a display section 130, an operation section 140, a bus 150, a frame memory 160, a storage section 170, and a power supply section 180. As the electronic apparatus 100, for example, a smartphone, a personal computer, an in-vehicle camera, or the like is assumed as well as a digital camera such as a digital still camera.

The optical section 110 focuses and guides light from a subject to the solid-state imaging element 230. The solid-state imaging element 230 is configured to synchronize with a vertical synchronization signal to generate image data by photoelectric conversion. In this regard, the vertical synchronization signal is a periodic signal with a predetermined frequency indicating a timing for imaging. The solid-state imaging element 230 supplies image data generated to the DSP circuit 120 via a signal line 239.

The DSP circuit 120 is configured to execute predetermined signal processing on image data from the solid-state imaging element 230. The DSP circuit 120 outputs processed image data to the frame memory 160 and the like via the bus 150. Note that the DSP circuit 120 is an example of a processing section described in claims.

The display section 130 displays image data. As the display section 130, for example, a liquid crystal panel or an organic EL (Electro Luminescence) panel is assumed. The operation section 140 is configured to generate an operation signal according to operation of a user.

The bus 150 is a common path through which data is exchanged among the optical section 110, the solid-state imaging element 230, the DSP circuit 120, the display section 130, the operation section 140, the frame memory 160, the storage section 170, and the power supply section 180.

The frame memory 160 holds image data. The storage section 170 is configured to store various data such as image data. The power supply section 180 supplies power to the solid-state imaging element 230, the DSP circuit 120, the display section 130, and the like.

In the configuration described above, for example, the solid-state imaging element 230 is mounted in the semiconductor package.

Configuration Example of Semiconductor Package

Figure 2:
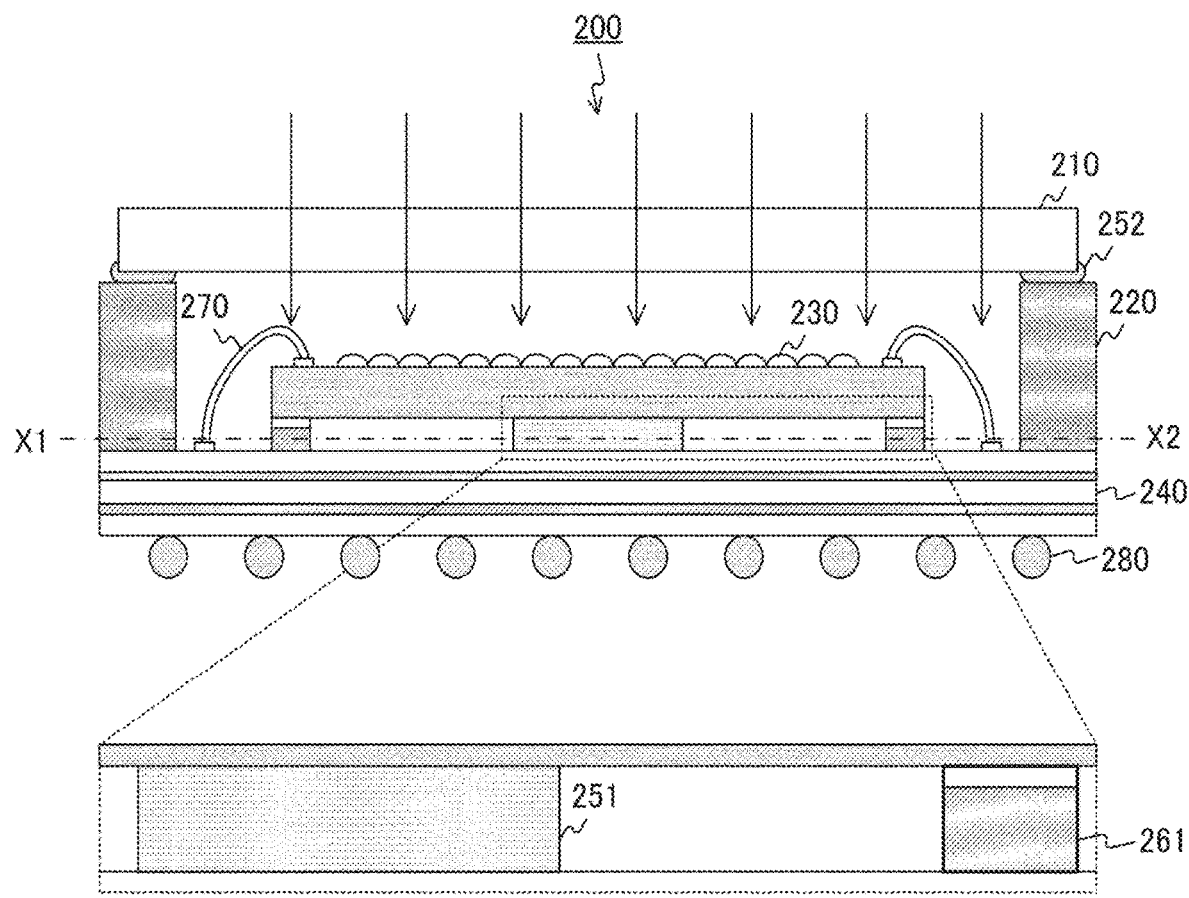
FIG. 2 is a cross-sectional view depicting a configuration example of a semiconductor package according to an embodiment of the present technology.

FIG. 2 is a cross-sectional view depicting a configuration example of a semiconductor package 200 according to an embodiment of the present technology. The semiconductor package 200 includes glass 210, a glass mounting frame 220, the solid-state imaging element 230, and a substrate 240.

The substrate 240 is a substrate on which the solid-state imaging element 230 is mounted. The substrate 240 is manufactured by stacking a plurality of layers on one another. Additionally, the solid-state imaging element 230 is mounted on one surface of opposite surfaces of the substrate 240, and this surface is referred to as a "front surface" of the substrate 240. A plurality of solder balls 280 is formed on a back surface of the substrate 240 opposite to the front surface. Additionally, various wires are formed on the front surface of and inside the substrate 240.

An axis perpendicular to the front surface of the substrate 240 is designated as a "Z axis." Additionally, a predetermined axis parallel to the front surface of the substrate 240 is designated as an "X axis," and an axis perpendicular to the Z axis and the X axis is designated as a "Y axis." FIG. 2 is a cross-sectional view taken along a cross section perpendicular to the Y axis.

The glass mounting frame 220 is a frame-like member on which the glass 210 is mounted. The glass mounting frame 220 is formed on the front surface of the substrate 240 along the outer periphery of the front surface. The glass 210 is bonded to the glass mounting frame 220 by a bonding portion 252. The glass 210 closes the semiconductor package 200.

The solid-state imaging element 230 photoelectrically converts light incident via the glass 210, imaging image data. In FIG. 2, arrows indicate incident light. A pixel array portion in which a plurality of pixels is arranged is formed on one surface of the opposite surfaces of the solid-state imaging element 230 corresponding to a light receiving side surface, and this surface is referred to as a "front surface" of the solid-state imaging element 230. On this front surface, a predetermined number of pads are formed around the pixel array portion, and first ends of wires 270 are connected to the respective pads. Second ends of the wires 270 are connected to respective pads on the front surface of the substrate 240. Thus, the solid-state imaging element 230 is mounted by wire bonding.

Additionally, a part of a back surface of the solid-state imaging element 230 opposite to the front surface is bonded to the front surface of the substrate 240 by a bonding portion 251 in order to prevent misalignment of the solid-state imaging element 230, with the remaining part of the back surface unbonded. For example, only the central portion of the back surface of the solid-state imaging element 230 is bonded by the bonding portion 251. As the bonding portion 251, an adhesive is used that has a certain degree of flexibility (in other words, resilience) within an operating temperature range. For example, a silicone-based adhesive is used that is flexible in the range from −40 to 125 degrees (° C.).

Additionally, a predetermined number of protrusions 261 are provided on the front surface of the substrate 240. Assuming that a direction from the back surface to front surface of the substrate 240 is an up direction, the protrusions 261 are provided in a down direction of or below an area of the back surface of the solid-state imaging element 230 which area is provided with no adhesive. In other words, the protrusions 261 protrude along the Z axis direction from the front surface of the substrate 240 to the remaining part of the back surface of the solid-state imaging element 230 which part is unbonded. In other words, the protrusions 261 are disposed in a portion of the substrate 240 side which portion does not correspond to the bonding portion 251 (the periphery of the bonding portion 251 and the like). Additionally, an upper portion of the protrusion 261 is in contact with the back surface of the solid-state imaging element 230 but is not secured. In addition, solder resist or the like is desirably applied to the upper portion of the protrusion 261 to provide the upper portion with insulation properties. The protrusions 261 are used as a cradle that receives loads during a wire bonding step described below.

Note that the solid-state imaging element 230 is mounted on the substrate 240 but that a semiconductor element other than the solid-state imaging element 230 may be mounted on the substrate 240. For example, instead of the solid-state imaging element 230, any of various sensors such as a ToF (Time of Flight) sensor can be mounted. Note that the solid-state imaging element 230 is an example of the semiconductor element recited in the claims.

Figure 3:
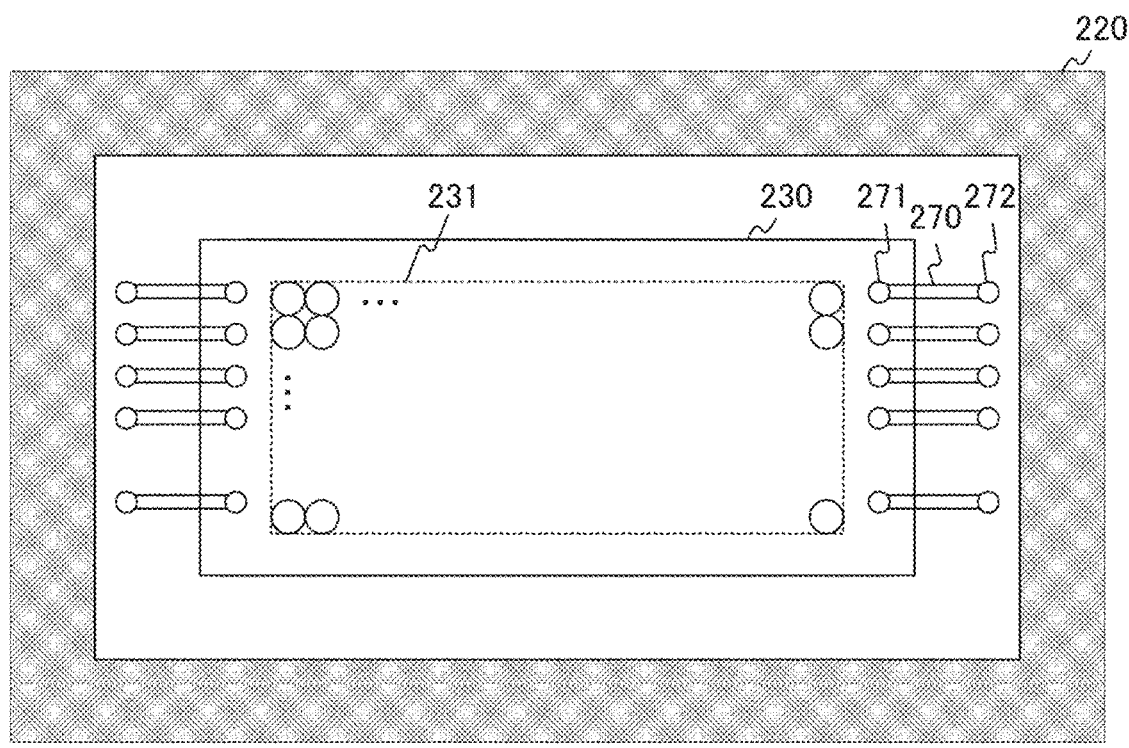
FIG. 3 is an example of a top view of a semiconductor package according to an embodiment of the present technology.
Figure 3:
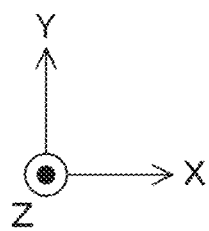

FIG. 3 is an example of a top view of the semiconductor package 200 according to an embodiment of the present technology. The substrate 240 is shaped like a rectangle as viewed in the Z axis direction, and the glass mounting frame 220 is formed along the outer periphery of the substrate 240.

The solid-state imaging element 230 shaped like a rectangle is mounted in the area enclosed by the glass mounting frame 220. The front surface of the solid-state imaging element 230 is provided with a pixel array portion 231 in which a plurality of pixels is arranged in a two-dimensional grid form. A predetermined number of pads 271 are disposed around the pixel array portion 231. For example, the pads 271 are arranged along two parallel sides of the four sides of the solid-state imaging element 230. Additionally, on the front surface of the substrate 240, a predetermined number of pads 272 are disposed around the solid-state imaging element 230. The pads 271 are connected to the pads 272 with the wires 270.

Figure 4:
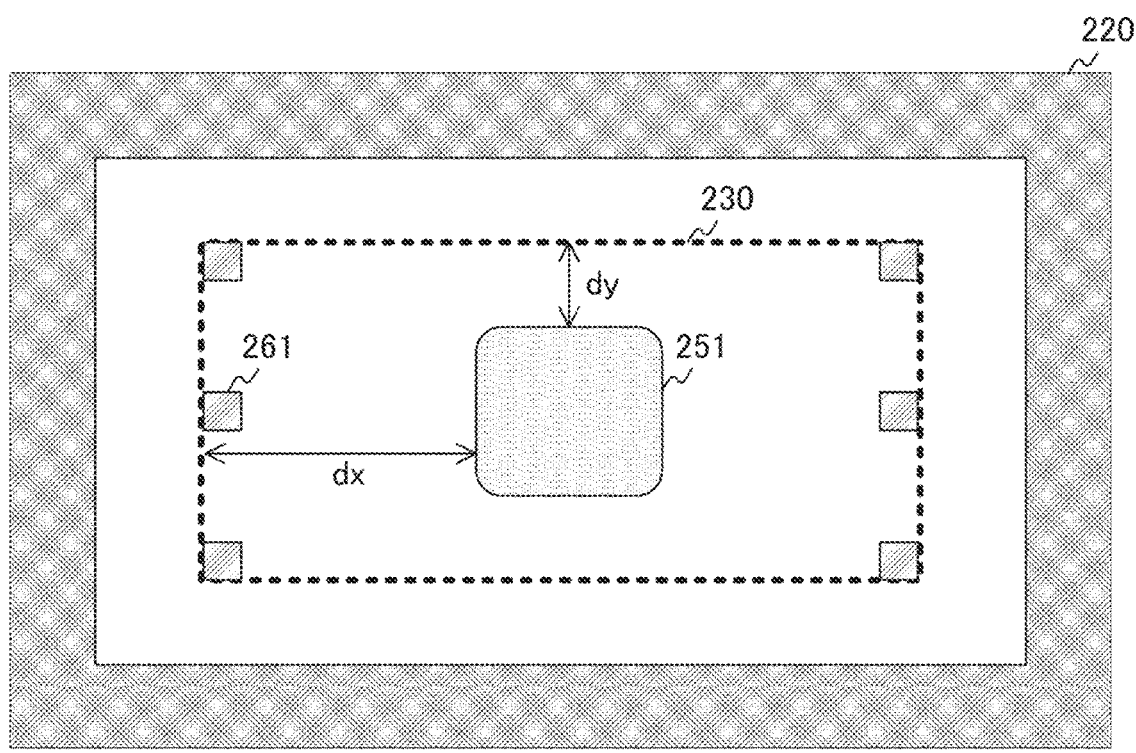
FIG. 4 is an example of a plan view depicting a shape and an arrangement of protrusions according to an embodiment of the present technology.

FIG. 4 is an example of a plan view depicting a shape and an arrangement of the protrusions 261 according to an embodiment of the present technology. FIG. 4 is a plan view obtained when the semiconductor package 200 is cut across a plane perpendicular to the Z axis along an X1 to X2 axis in FIG. 2.

A thick dotted line in FIG. 4 indicates the outer periphery of the solid-state imaging element 230. As illustrated in FIG. 4, the bonding portion 251 is formed in a part (for example, the central portion) of the back surface of the solid-state imaging element 230. In this regard, the "central portion" means an area delimited by predetermined border lines each located at a predetermined distance or larger from the outer periphery of the solid-state imaging element 230.

For example, the bonding portion 251 is shaped like a rectangle, and the distance between each side of the solid-state imaging element 230 and each side of the bonding portion 251 (that is, the central portion) is dx or dy. The distances dx and dy from the outer peripheral portion are set to values corresponding to the degree of warpage expected to occur in the substrate 240. A higher degree of expected warpage sets dx and dy to larger values. Note that the bonding portion 251 is shaped like a rectangle but that the shape is not limited to the rectangle and may be a circle or an indefinite shape.

Additionally, on the front surface of the substrate 240, a plurality of protrusions 261 is disposed in portions not corresponding to the bonding portion 251 (for example, areas around the bonding portion 251). For example, along two sides on which the pads 271 are arranged, island-like protrusions 261 are arranged below the pads 271. In addition, as viewed in the Z axis direction, the protrusion 261 is shaped like a rectangle or a circle. Additionally, the protrusion 261 is desirably disposed at a position opposite to a corner of the rectangular solid-state imaging element 230. In FIG. 4, the protrusion 261 is disposed in all of the four corners of the rectangle.

FIGS. 5A and 5B are examples of a cross-sectional view of the semiconductor package 200 at high temperature and at low temperature according to an embodiment of the present technology. In FIGS. 5A and 5B, FIG. 5A is an example of a cross-sectional view of the semiconductor package 200 at high temperature, and FIG. 5B is an example of a cross-sectional view of the semiconductor package 200 at low temperature.

As described above, the substrate 240 includes a plurality of layers. In a case where the layers have different coefficients of thermal expansion, the substrate 240 may be warped due to a change in temperature. For example, in a case where an environmental temperature is higher than a predetermined temperature, the substrate 240 is warped upward as illustrated in FIG. 5A. On the other hand, in a case where the environmental temperature is lower than the predetermined temperature, the substrate 240 is warped downward as illustrated in FIG. 5B.

On the other hand, the back surface of the solid-state imaging element 230 is not entirely bonded, and only a part of the back surface (the central portion or the like) is bonded by the bonding portion 251. Additionally, the protrusions 261 disposed in the portions (the areas around the bonding portion 251 or the like) other than the bonding portion 251 are not secured to the back surface of the solid-state imaging element 230. Thus, even in a case where the substrate 240 is warped upward, as illustrated in FIG. 5A, the protrusions 261 are separated from the solid-state imaging element 230, suppressing the warpage of the solid-state imaging element 230. Additionally, even in a case where the substrate 240 is warped downward, as illustrated in FIG. 5B, the bonding portion 251 in the central portion, which has flexibility, somewhat expands, suppressing the warpage of the solid-state imaging element 230.

In this regard, the semiconductor package in a comparative example will be considered. In this configuration, the back surface of the solid-state imaging element is entirely bonded to the front surface of the substrate.

FIGS. 6A and 6B are examples of a cross-sectional view of the semiconductor package at high temperature and at low temperature in the comparative example. In FIGS. 6A and 6B, FIG. 6A is an example of a cross-sectional view of the semiconductor package 200 at high temperature, and FIG. 6B is an example of a cross-sectional view of the semiconductor package 200 at low temperature.

In a case where the environmental temperature is higher than the predetermined temperature, the substrate is warped upward as illustrated in FIG. 6A. In the comparative example, the back surface of the solid-state imaging element is entirely bonded to the substrate, and thus the solid-state imaging element is warped along with the substrate.

On the other hand, in a case where the environmental temperature is lower than the predetermined temperature, the substrate is warped downward as illustrated in FIG. 6B. In the comparative example, the back surface of the solid-state imaging element is entirely bonded to the substrate, and thus the solid-state imaging element is warped as in the case where the environmental temperature is higher than the predetermined temperature.

A warped solid-state imaging element may distort an image surface, degrading image quality of image data. In contrast, a configuration with only the central portion of the back surface of the solid-state imaging element 230 bonded can prevent the solid-state imaging element 230 from being warped, improving the image quality.

Method for Manufacturing Semiconductor Package

Subsequently, a method for manufacturing the semiconductor package 200 will be described.

FIGS. 7A and 7B illustrate diagrams for explaining the manufacturing method up to formation of the glass mounting frame 220 according to an embodiment of the present technology. In FIGS. 7A and 7B, FIG. 7A is a diagram illustrating the step of manufacturing the substrate 240. FIG. 7B is a diagram illustrating the step of forming the glass mounting frame 220.

A manufacturing system for the semiconductor package 200 manufactures the substrate 240 with the protrusions 261 formed on the front surface as illustrated in FIG. 7A. In this regard, the protrusions 261 are formed, for example, simultaneously with formation of the wiring pattern of the substrate 240. The protrusion 261 is, for example, 10 to 20 micrometers (μm) in height. Note that the manufacturing system can separately form the protrusions 261 after manufacturing the substrate 240 as described below.

Then, the manufacturing system forms the glass mounting frame 220 along the outer periphery of the substrate 240 as illustrated in FIG. 7B.

FIGS. 8A, 8B, and 8C illustrate diagrams for explaining the manufacturing method up to placement of the glass 210 and the solder balls 280 according to an embodiment of the present technology. In FIGS. 8A, 8B, and 8C, FIG. 8A is a diagram illustrating the step of applying an adhesive. FIG. 8B is a diagram illustrating the step of mounting the solid-state imaging element 230. FIG. 8C is a diagram illustrating the step of placing the glass 210 and the solder balls 280.

As illustrated in FIG. 8A, the manufacturing system applies an adhesive to an area of the front surface of the substrate 240 which area corresponds to the central portion of the solid-state imaging element 230. The adhesive functions as the bonding portion 251.

Then, as illustrated at in FIG. 8B, the manufacturing system bonds the central portion of the back surface of the solid-state imaging element 230 and electrically connects the solid-state imaging element 230 to the substrate 240 with the wires 270. As this wire bonding, for example, ultrasonic wire bonding is used in which ultrasonic waves are applied, with loads imposed on points where the wires 270 are connected. In a case where no protrusions 261 are provided, imposing loads may tilt the solid-state imaging element 230 with respect to the substrate 240. However, the protrusions 261 disposed below the connection points function as cradles, allowing the solid-state imaging element 230 to be prevented from being tilted.

As described above, wire bonding is performed in an environment with loads and ultrasonic waves applied, and thus, a material used for the protrusions 261 have a certain strength and can prevent ultrasonic waves from escaping.

Subsequently, as illustrated in FIG. 8C, the manufacturing system bonds the glass 210 to the glass mounting frame 220 and mounts a predetermined number of the solder balls 280 on the back surface of the substrate 240.

Figure 9:
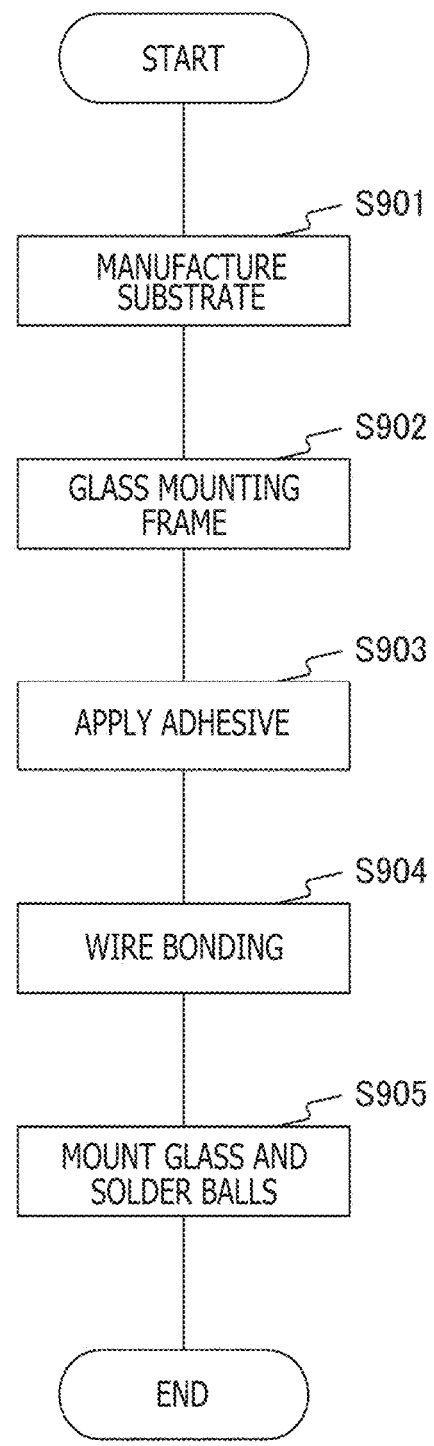
FIG. 9 is a flowchart depicting an example of a method for manufacturing a semiconductor package according to an embodiment of the present technology.

FIG. 9 is a flowchart depicting an example of the method for manufacturing the semiconductor package 200 according to an embodiment of the present technology. The manufacturing system first manufactures the substrate 240 provided with the protrusions 261 (step S901) and forms the glass mounting frame (step S902).

Then, the manufacturing system applies an adhesive to the area corresponding to the central portion of the solid-state imaging element 230 (step S903), and mounts the solid-state imaging element 230 by wire bonding (step S904). Then, the manufacturing system mounts the glass 210 and the solder balls 280 (step S905). After step S905, the manufacturing system executes the remaining steps such as a testing step, and ends the manufacturing of the semiconductor package 200.

As described above, according to an embodiment of the present technology, a part (the central portion or the like) of the back surface of the solid-state imaging element 230 is bonded to the substrate 240, allowing the solid-state imaging element 230 to be prevented from being warped. Additionally, on the front surface of the substrate 240, the protrusions 261 are provided in the portions not corresponding to the bonding portion 251 (the areas around the bonding portion 251 or the like), allowing the protrusions 261 to receive loads applied to the solid-state imaging element 230 during wire bonding. Thus, the solid-state imaging element 230 can be mounted by wire bonding.

First Modified Example

In the embodiment described above, the protrusions 261 are formed during the formation of the wiring pattern. However, the shape of a mask for forming the wiring pattern needs to be changed. The semiconductor package 200 in a first modified example of an embodiment differs from the semiconductor package 200 of the embodiment in that the protrusions 261 are provided after the manufacturing of the substrate 240.

FIGS. 10A and 10B illustrate diagrams for explaining the manufacturing method up to provision of the protrusions according to the first modified example of the embodiment of the present technology. In FIGS. 10A and 10B, FIG. 10A is a diagram illustrating the step of forming the glass mounting frame 220. FIG. 10B is a diagram illustrating the step of providing the protrusions 261.

The manufacturing system of the modified example of the embodiment executes the step of forming the wiring pattern and other steps to manufacture the substrate 240 with no protrusions 261. Then, the manufacturing system forms the glass mounting frame 220 on the substrate 240 as illustrated in FIG. 10A. Subsequently, the manufacturing system bonds the protrusions 261 to the front surface of the substrate 240 as illustrated in FIG. 10B.

As illustrated in FIGS. 10A and 10B, providing the protrusions 261 after the manufacturing of the substrate 240 eliminates the need to change the step of manufacturing the substrate 240. For example, the need to change the mask for forming the wiring pattern is eliminated.

As described above, in the first modified example of the embodiment of the present technology, the protrusions 261 are provided after the manufacturing of the substrate 240, thus eliminating the need to change the step of manufacturing the substrate 240.

Second Modified Example

In the embodiment described above, the island-like protrusions 261 are formed. However, this shape has a small area that receives a load and may thus have an insufficient strength. The semiconductor package 200 of the second modified example of the embodiment differs from the semiconductor package 200 of the embodiment in that the protrusions 261 have a linear shape and thus have an increased strength.

Figure 11:
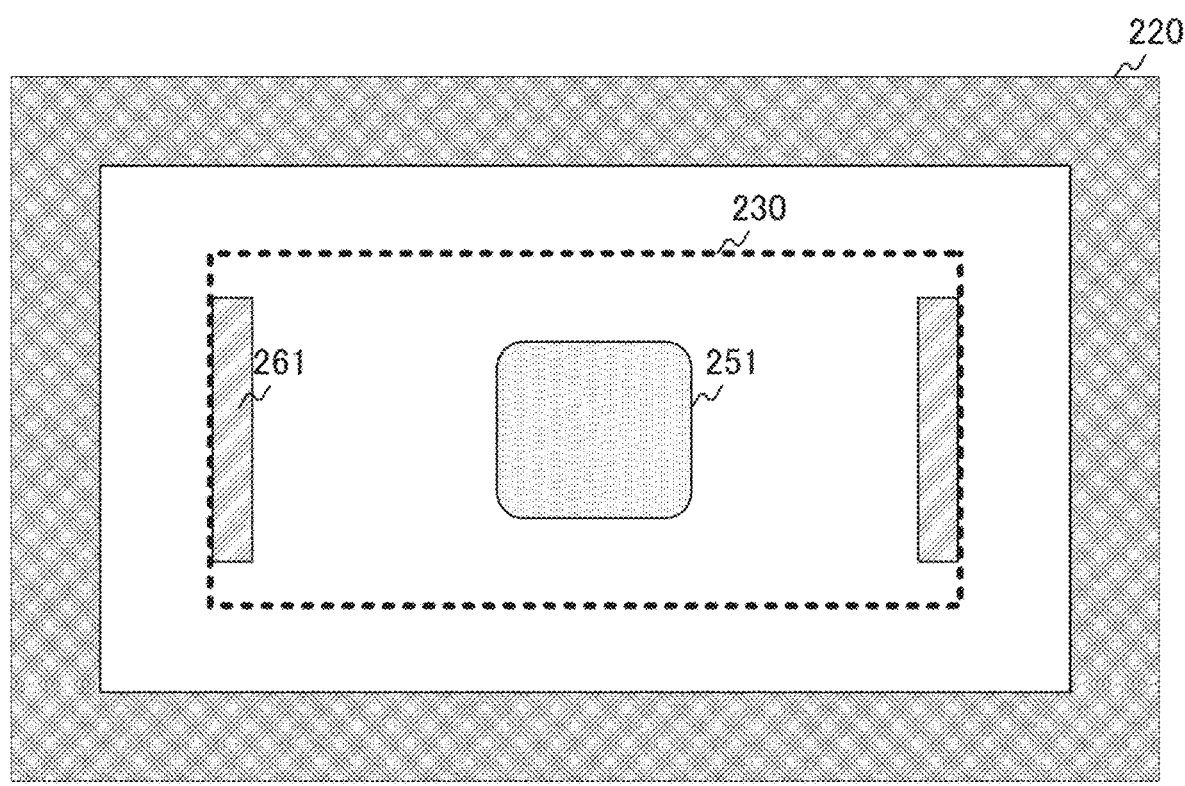
FIG. 11 is an example of a plan view depicting the shape and the arrangement of protrusions according to a second modified example of an embodiment of the present technology.

FIG. 11 is an example of a plan view depicting the shape and the arrangement of the protrusions 261 according to the second modified example of the embodiment of the present technology. As illustrated in FIG. 11, the protrusions 261 are formed linearly along two parallel sides of the four sides of the solid-state imaging element 230, shaped like a rectangle. The pads 271 are formed along each of the two sides. The linear formation of the protrusions 261 enable an increase in a strength of the protrusions 261.

Note that, in a case where the pads 271 are arranged along three sides, the protrusions 261 can be formed along each of the three sides instead of being formed along the two sides.

As described above, the second modified example of the embodiment of the present technology involves the linear formation of the protrusions 261, thus enabling an increase in the strength of the protrusions 261 compared to a configuration in which the protrusions 261 are formed like islands.

Third Modified Example

In the second modified example of the embodiment described above, the linear protrusions 261 are formed. However, this shape has a small area that receives a load, and thus has an insufficient strength. The semiconductor package 200 of the third modified example of the embodiment differs from the semiconductor package 200 of the embodiment in that the protrusion 261 is shaped like a frame to have an increased strength.

Figure 12:
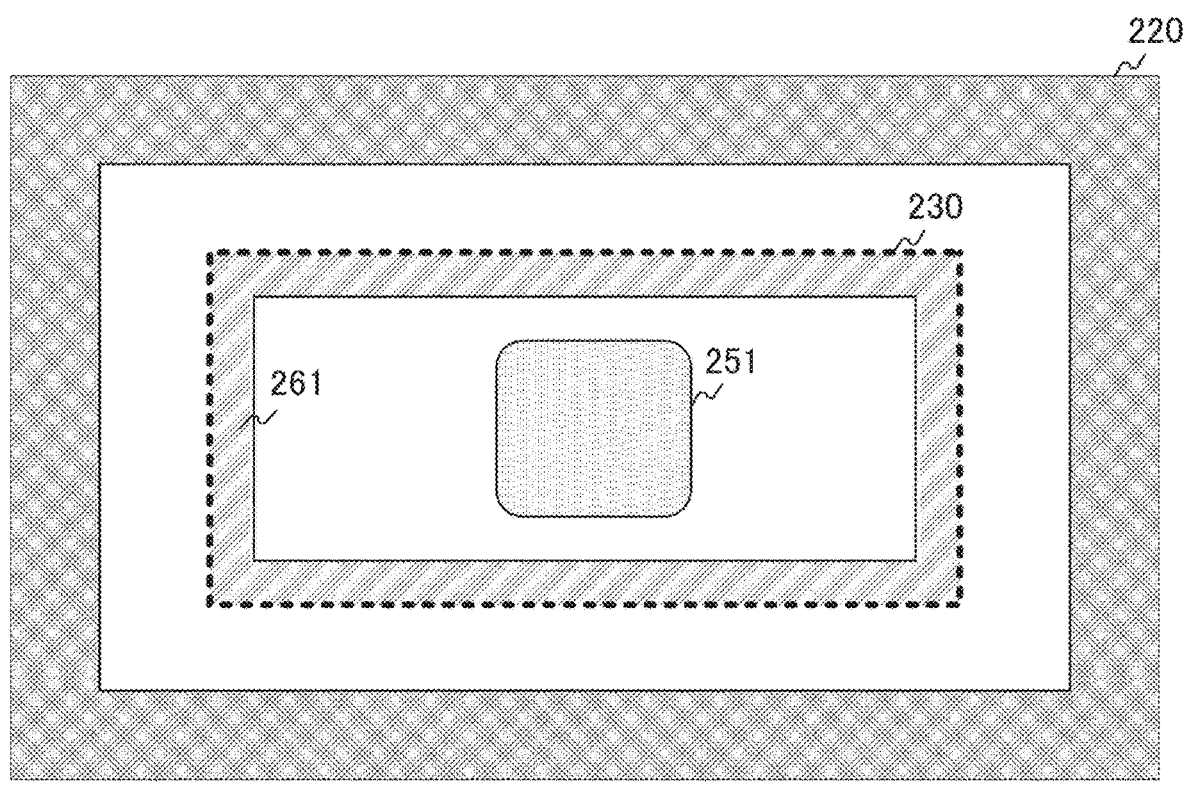
FIG. 12 is an example of a plan view depicting the shape and the arrangement of protrusions according to a third modified example of an embodiment of the present technology.

FIG. 12 is an example of a plan view depicting the shape and the arrangement of the protrusion 261 according to the second modified example of the embodiment of the present technology. As illustrated in FIG. 12, the protrusion 261 is formed like a frame along the outer periphery of the solid-state imaging element 230.

Figure 13:
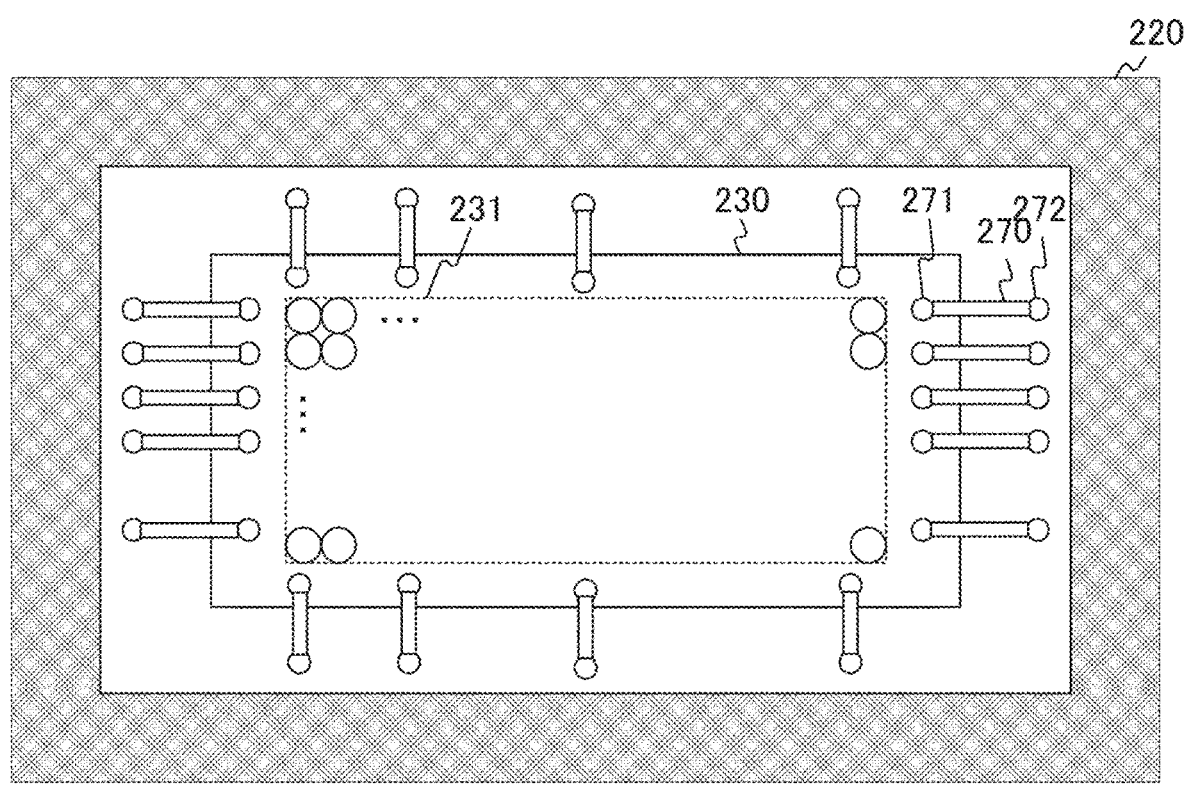
FIG. 13 is an example of a top view of a semiconductor package according to a third modified example of an embodiment of the present technology.

FIG. 13 is an example of a top view of the semiconductor package 200 according to the third modified example of the embodiment of the present technology. As illustrated in FIG. 13, the pads 271 are arranged along the outer periphery of the solid-state imaging element 230. When the protrusion 261 is formed like a frame in conformance with the arrangement of the pads 271, this configuration enables an increase in the strength of the protrusion 261 compared to the configuration in which the protrusions 261 are formed linearly.

As described above, the third modified example of the embodiment of the present technology involves the formation of the protrusion 261 like a frame, thus enabling an increase in the strength of the protrusion 261 compared to the configuration with the linear formation.

2. Examples of Application to Mobile Body

The technology according to the present disclosure (present technology) can be applied to various products. For example, the technology according to the present disclosure can be implemented as an apparatus mounted in any type of mobile body such as an automobile, an electric vehicle, a hybrid electric vehicle, a motorcycle, a bicycle, a personal mobility device, an airplane, a drone, a ship, or a robot.

Figure 14:
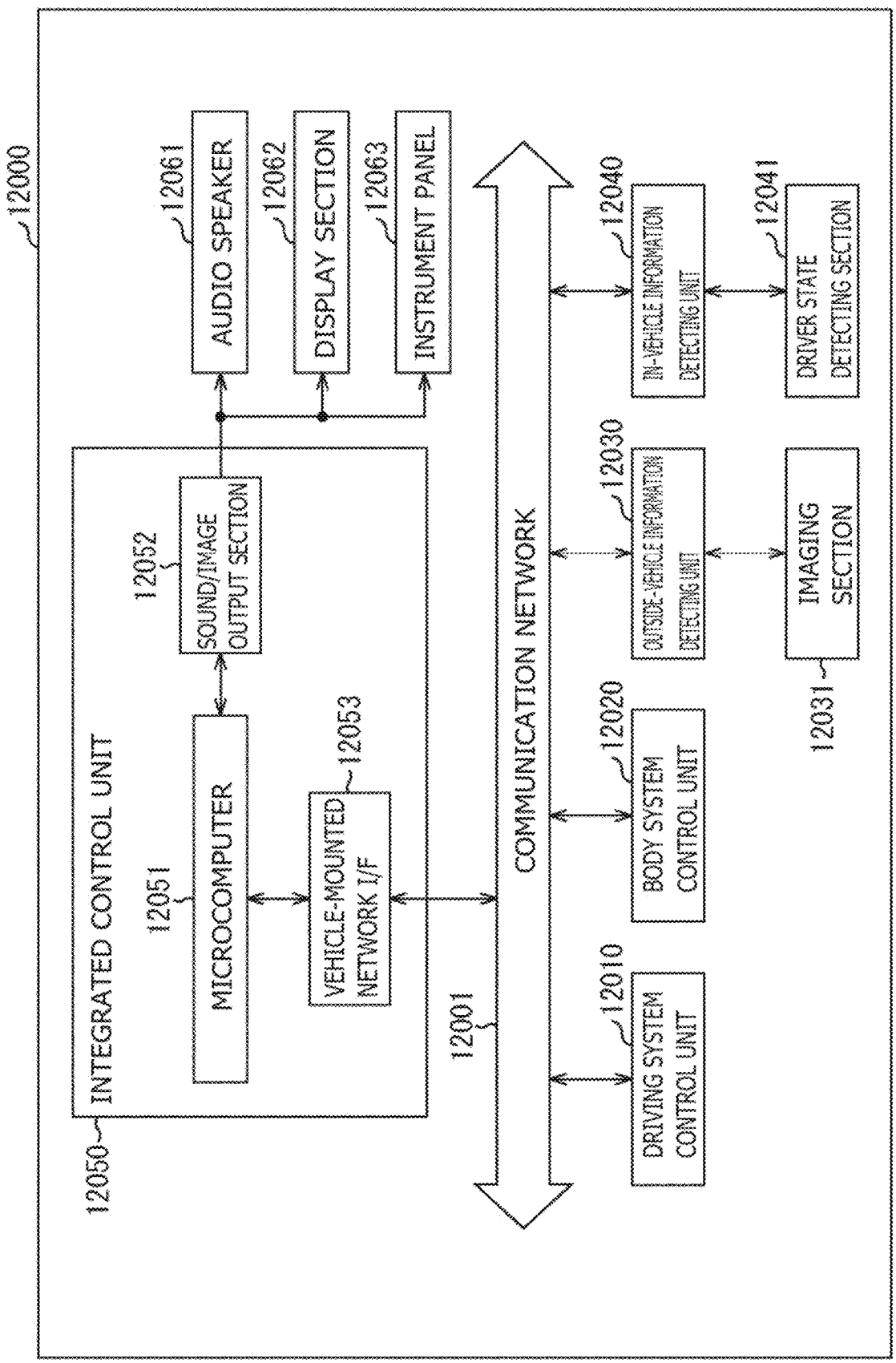
FIG. 14 is a block diagram depicting an example of schematic configuration of a vehicle control system.

FIG. 14 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display and a head-up display.

Figure 15:
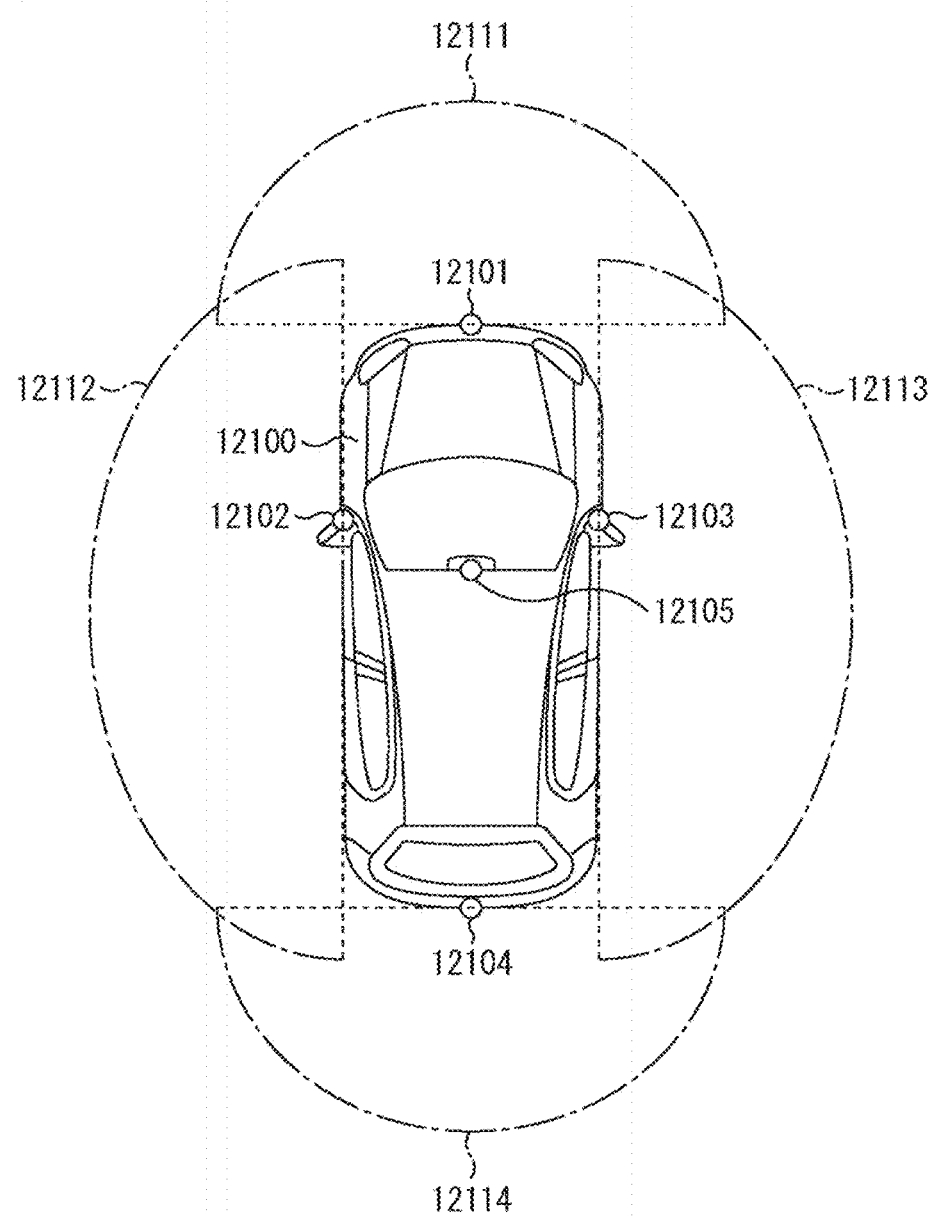
FIG. 15 is a diagram of assistance in explaining an example of installation positions of an outside-vehicle information detecting section and an imaging section.

FIG. 15 is a diagram depicting an example of the installation position of the imaging section 12031.

In FIG. 15, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system has been described above to which the technology according to the present disclosure may be applied. The technology according to the present disclosure may be applied to, for example, the imaging section 12032 included in the configuration described above. Specifically, the electronic apparatus 100 in FIG. 1 can be applied to the imaging section 12031. By applying the technology according to the present disclosure to the imaging section 12031, the solid-state imaging element 230 is prevented from being warped to allow more easy-to-see imaged images to be obtained, thus enabling a reduction in the fatigue of the driver.

Note that the embodiment described above illustrate examples for implementing the present technology, and the matters in the embodiment have correspondence relations with the matters used to specify the invention in the claims. Similarly, the matters used to specify the invention in the claims respectively have a correspondence relation with the matters in the embodiment of the present technology which matters have the identical names. However, the present technology is not limited to the embodiment and can be embodied by making various modifications to the embodiment without departing from the spirits of the present technology.

Note that the effects described herein are only illustrative and are not restrictive and that any other effect may be produced.

Note that the present technology can also take the following configurations.

(1)

A semiconductor package including:

a substrate including a front surface to which first ends of wires are connected;

a semiconductor element including opposite surfaces with second ends of the wires connected to one surface of the opposite surfaces;

a bonding portion bonding a part of another surface of the opposite surfaces and the front surface of the substrate; and protrusions protruding from the front surface of the substrate to a remaining part of the other surface.

(2)

The semiconductor package according to (1) described above, in which the bonding portion bonds a central portion of the other surface and the front surface of the substrate.

(3)

The semiconductor package according to (1) or (2) described above, in which the protrusions are formed like islands.

(4)

The semiconductor package according to (1) or (2) described above, in which the semiconductor element is shaped like a rectangle, and the protrusions are respectively formed linearly along a plurality of sides of the rectangle.

(5)

The semiconductor package according to (1) or (2) described above, in which the protrusion is formed like a frame along an outer periphery of the semiconductor element.

(6)
 The semiconductor package according to any one of (1) to (5) described above, in which
  the semiconductor element is a solid-state imaging element.
(7)
 An electronic apparatus including:
  a substrate including a front surface to which first ends of wires are connected;
  a semiconductor element including opposite surfaces with second ends of the wires connected to one surface of the opposite surfaces;
  a bonding portion bonding a part of another surface of the opposite surfaces and the front surface of the substrate;
  protrusions protruding from the front surface of the substrate to a remaining part of the other surface; and
  a processing section processing a signal generated by the semiconductor element.
(8)
 A method for manufacturing a semiconductor package, the method including:
  a substrate manufacturing step of manufacturing a substrate provided with protrusions on a front surface of the substrate; and
  a connection step of bonding the front surface of the substrate and a part of one surface of opposite surfaces of a semiconductor element and connecting another surface of the opposite surfaces and the front surface of the substrate with wires.
(9)
 The method for manufacturing a semiconductor package according to (8) described above, in which
  in the substrate manufacturing step, the protrusions are provided when a wiring pattern for the substrate is formed.
(10)
 The method for manufacturing a semiconductor package according to (8) described above, in which
  in the substrate manufacturing step, the protrusions are provided on the substrate after the substrate is manufactured.

REFERENCE SIGNS LIST

100: Electronic apparatus
110: Optical section
120: DSP circuit
130: Display section
140: Operation section
150: Bus
160: Frame memory
170: Storage section
180: Power supply section
200: Semiconductor package
210: Glass
220: Glass mounting frame
230: Solid-state imaging element
231: Pixel array portion
240: Substrate
251, 252: Bonding portion
261: Protrusion
270: Wire
271, 272: Pad
280: Solder ball
12031: Imaging section

The invention claimed is:
1. A semiconductor package, comprising:
 a substrate that includes a front surface;
 a plurality of wires, wherein
  each wire of the plurality of wires has a first end and a second end, and
  the front surface of the substrate is connected to the first end of each wire of the plurality of wires;
 a semiconductor element that includes a first surface and a second surface, wherein
  the first surface is opposite to the second surface, and
  the second end of each wire of the plurality of wires is connected to the first surface of the semiconductor element;
 a bonding portion configured to bond a first part of the second surface of the semiconductor element and the front surface of the substrate; and
 a plurality of protrusions configured to protrude from the front surface of the substrate to a second part of the second surface of the semiconductor element, wherein
  the second part corresponds to a remaining part of the second surface other than the first part.
2. The semiconductor package according to claim 1, wherein
 the first part corresponds to a central portion of the second surface of the semiconductor element.
3. The semiconductor package according to claim 1, wherein each protrusion of the plurality of protrusions has an island structure.
4. The semiconductor package according to claim 1, wherein
 the semiconductor element has a rectangle shape, and
 the plurality of protrusions is linear along a plurality of sides of the rectangle shaped semiconductor element.
5. The semiconductor package according to claim 1, wherein
 each protrusion of the plurality of protrusions has a frame structure, and
 each protrusion of the plurality of protrusions is along an outer periphery of the semiconductor element.
6. The semiconductor package according to claim 1, wherein the semiconductor element is a solid-state imaging element.
7. An electronic apparatus, comprising:
 a substrate that includes a front surface;
 a plurality of wires, wherein
  each wire of the plurality of wires has a first end and a second end, and
  the front surface is connected to the first end of each wire of the plurality of wires;
 a semiconductor element that includes a first surface and a second surface, wherein
  the first surface is opposite to the second surface, and
  the second end of each wire of the plurality of wires is connected to the first surface of the semiconductor element;
 a bonding portion configured to bond a first part of the second surface of the semiconductor element and the front surface of the substrate;
 a plurality of protrusions configured to protrude from the front surface of the substrate to a second part of the second surface of the semiconductor element, wherein
  the second part corresponds to a remaining part of the second surface other than the first part, and
  the semiconductor element is configured to generate a signal; and a processing section configured to process the signal generated by the semiconductor element.

8. A method for manufacturing a semiconductor package, the method comprising:
   manufacturing a substrate, wherein the substrate includes a front surface;
   forming a plurality of protrusions on the front surface of the substrate;
   bonding the front surface of the substrate and a first part of a first surface of a semiconductor element, wherein
      the plurality of protrusions protrudes from the front surface of the substrate to a second part of the first surface of the semiconductor element, and
      the second part of the first surface corresponds to a remaining part of the first surface other than the first part; and
   connecting a second surface of the semiconductor element and the front surface of the substrate with a plurality of wires, wherein
      the first surface is opposite to the second surface.

9. The method for manufacturing the semiconductor package according to claim 8, further comprising forming a wiring pattern for the substrate, wherein the formation of the wiring pattern on the substrate is simultaneous with the formation of the plurality of protrusions.

10. The method for manufacturing the semiconductor package according to claim 8, wherein
   the formation of the plurality of protrusions on the substrate is after the manufacture of the substrate.

* * * * *